(12) United States Patent
Gorfajn et al.

(10) Patent No.: US 7,984,359 B2
(45) Date of Patent: Jul. 19, 2011

(54) CORRECTION OF DATA ERRORS IN A MEMORY BUFFER

(75) Inventors: Julian Gorfajn, Brookline, MA (US); Bruce Buch, Westborough, MA (US); E. William Bruce, II, Westminister, MA (US)

(73) Assignee: Seagate Technology, LLC, Cupertino, CA (US)

( * ) Notice: Subject to any disclaimer, the term of this patent is extended or adjusted under 35 U.S.C. 154(b) by 1128 days.

(21) Appl. No.: 11/787,357

(22) Filed: Apr. 16, 2007

(65) Prior Publication Data

US 2007/0283217 A1    Dec. 6, 2007

Related U.S. Application Data

(60) Provisional application No. 60/746,076, filed on May 1, 2006.

(51) Int. Cl.
*H03M 13/00* (2006.01)
(52) U.S. Cl. ........................................................ 714/764
(58) Field of Classification Search .................. 714/755, 714/758, 763, 764, 768, 777
See application file for complete search history.

(56) References Cited

U.S. PATENT DOCUMENTS

| | | | |
|---|---|---|---|
| 4,151,510 A | 4/1979 | Howell et al. | |
| 4,509,172 A | 4/1985 | Chen | |
| 4,541,091 A | 9/1985 | Nishida et al. | |
| 5,099,484 A | 3/1992 | Smelser | |
| 5,369,652 A | 11/1994 | Bailey et al. | |
| 5,436,917 A | 7/1995 | Karasawa | |
| 5,555,250 A | 9/1996 | Walker et al. | |
| 5,691,994 A | 11/1997 | Acosta et al. | |
| 5,721,739 A * | 2/1998 | Lyle | 714/755 |
| 5,996,105 A * | 11/1999 | Zook | 714/755 |
| 6,041,430 A | 3/2000 | Yamauchi | |
| 7,065,702 B2 | 6/2006 | Oren | |
| 7,076,723 B2 * | 7/2006 | Saliba | 714/768 |
| 7,099,993 B2 | 8/2006 | Keeler | |
| 7,174,485 B2 | 2/2007 | Silvus | |
| 7,205,912 B1 | 4/2007 | Yang et al. | |
| 7,263,650 B2 | 8/2007 | Keeler et al. | |
| 7,318,121 B2 | 1/2008 | Gaertner et al. | |
| 7,325,155 B2 | 1/2008 | Trantham et al. | |
| 7,340,665 B2 | 3/2008 | Tsang | |
| 7,421,642 B2 | 9/2008 | Williamson et al. | |
| 7,546,511 B2 | 6/2009 | You et al. | |
| 7,587,658 B1 | 9/2009 | Tong et al. | |
| 2003/0192005 A1 | 10/2003 | Williamson et al. | |
| 2006/0041819 A1 | 2/2006 | Yang et al. | |
| 2006/0133607 A1 | 6/2006 | Forehand et al. | |

\* cited by examiner

*Primary Examiner* — Shelly A Chase
(74) *Attorney, Agent, or Firm* — Theodore M. Magee; Westman, Champlin & Kelly, P.A.

(57) ABSTRACT

Methods, circuits, and disk drive that correct errors in data that is temporarily stored in a memory buffer are disclosed. An error detection code and an error correction code are generated for data. The data, the error detection code, and the error correction code are stored in the memory buffer. The data is retrieved from the memory buffer and error detected using the error detection code. In response to detecting an error, the error correction code is applied to the retrieved data to generate corrected data.

19 Claims, 5 Drawing Sheets

CORRECTION OF DATA ERRORS IN A MEMORY BUFFER

RELATED APPLICATION

This application claims the benefit of and priority to U.S. Provisional Patent Application No. 60/746,076, filed May 1, 2006, the disclosure of which is hereby incorporated herein by reference as if set forth in its entirety.

FIELD OF THE INVENTION

The present invention generally relates to correcting errors in digital data and, more particularly, to correcting errors in data that is temporarily buffered during communication between a host device and a data storage device.

BACKGROUND OF THE INVENTION

Data storage devices are widely used by host devices, such as desktop computers, laptop computers, personal digital assistants, digital picture/video recorders/players, and digital music recorders/players, to store/retrieve digital data. Some types of data storage devices include magnetic disk drives, optical disk drives, electro-optical disk drives, and magnetic tape drives. A common characteristic of these data storage devices is that they include data storage media that moves relative to one or more read/write transducers. Data is written to/read from a defined location on the media by controllably moving the media and/or the read/write transducer relative to one another so that the read/write transducer can access the defined location on the media. As can be appreciated, such controlled movements take time which can decrease the data storage/retrieval bandwidth of the data storage device.

In an attempt to increase storage/retrieval bandwidth, some data storage devices temporarily store data that has been read from the media into a memory buffer until the data can be output to the host, and may temporarily store data received from the host in the memory buffer until the data can be written to the media. The data storage device may operate in a Write Cache Enabled mode in which it acknowledges to the host that a write command has been completed after the data received from the host device has been stored in the memory buffer, but prior to the data actually being written to the media.

The data is typically appended with an error detection code to provide a data integrity check capability between data that is stored in the data storage device and then subsequently retrieved therefrom. The error detection code may be appended as another word at the end of the data so as to be compatible with conventional memory buffer widths and to facilitate the writing/reading of the data and corresponding error detection code to/from the media.

When data is read from the media, the error detection code is used to determine if the data has sustained any errors while it was stored on the media and/or while it was being read from and/or written to the media. When errors are identified, further attempts may be made to read error-free data from the media. For example, in response to detecting a data error while carrying out a read command from a host, the data storage device may inform the host that a data error has occurred and request the host to initiate re-reading of the data via a subsequent read command. As can be appreciated, such attempts to re-read the data can introduce an undesirable delay in outputting the data to the host, and the data error indication to the host may be undesirably interpreted by a user as a general failure of the data storage device.

When the data storage device is operating in the Write Cache Enabled mode, if the data is corrupted after the data storage device has acknowledged to the host that a write command has been completed, the data storage device may not be able to subsequently request that the host resend that data thereto, since the host may have already released resources holding the data and/or references to it. Accordingly, the data may be lost.

Some data storage devices may also append an error correction code to the data and associated error detection code that are stored on the media. Error correction codes may be applied to individual data words and/or to blocks of data words. A data storage device may thereby identify errors when reading data from the media using the error detection code, and may then attempt to correct errors using the error correction code. Unfortunately, stronger error detection codes (i.e., codes that can detect more data errors) and stronger error correction codes (i.e., codes that can correct more data errors) typically increase, and may substantially increase, the combined length of the data and appended codes relative to weaker codes. Moreover, memory buffers are typically available in bit widths based on a power of 2. For example, a 16-bit length data word that is protected using a per-word error correction code may result in 21 bits of data and appended error correction code. The 21 bit length data and code may necessitate that the data storage device use a 32-bit wide memory buffer to temporarily buffer the data and appended error correction code while it awaits writing to the media, which results in less efficient use of the memory buffer.

SUMMARY OF THE INVENTION

Some embodiments of the present invention are directed to methods of correcting errors in data that is temporarily stored in a memory buffer. An error detection code and an error correction code are generated for data. The data, the error detection code, and the error correction code are stored in the memory buffer. The data is retrieved from the memory buffer and error detected using the error detection code. In response to detecting an error, the error correction code is applied to the retrieved data to generate corrected data.

These and other embodiments of the present invention are explained below with reference to the following drawings.

DETAILED DESCRIPTION OF THE INVENTION

The present invention now will be described more fully hereinafter with reference to the accompanying drawings, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the figures and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

It will be understood that, as used herein, the term "comprising" or "comprises" is open-ended, and includes one or more stated elements, steps and/or functions without precluding one or more unstated elements, steps and/or functions. As used herein, the singular forms "a", "an" and "the" are intended to include the plural forms as well, unless the context clearly indicates otherwise. As used herein the terms "and/or" and "/" include any and all combinations of one or more of the associated listed items. It will be understood that, although the terms first, second, etc. may be used herein to describe various elements, operations, and/or regions, these elements, operations, and/or regions should not be limited by these terms. These terms are only used to distinguish one element/operation/region from another element/operation/region. Thus, a first element/operation/region discussed below could be termed a second element/operation/region without departing from the teachings of the present invention.

The present invention may be embodied in hardware and/or in software (including firmware, resident software, microcode, etc.). Consequently, as used herein, the term "signal" may take the form of a continuous waveform and/or discrete value(s), such as digital value(s) in a memory.

The present invention is described below with reference to block diagrams of disk drives, disks, controllers, and operations according to various embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

As described above, a data storage device may temporarily store data in a memory buffer while the data awaits being written to and/or read from a data storage media. While the data resides in the data storage media it may incur an error, such as a soft bit error induced by solar particles. Some embodiments of the present invention are directed to identifying and correcting errors that may occur in data from a host device while it is temporarily stored in a memory buffer waiting to be more permanently stored in a data storage device. Some other embodiments of the present invention are directed to identifying and correcting errors that may occur in data that has been retrieved from a data storage media of the data storage device and is temporarily stored in the memory buffer waiting to be output to the host device. The data storage device may include, but is not limited to, a magnetic disk drive, an optical disk drive, an electro-optical disk drive, a magnetic tape drive, and/or another nonvolatile storage device. Accordingly, although exemplary embodiments of the present invention are described in the context of a disk drive that includes magnetic data storage disk(s) for purposes of explanation, it is to be understood that embodiments of the present invention are not limited thereto and may instead can be applicable to other types of data storage devices.

Figure 1:
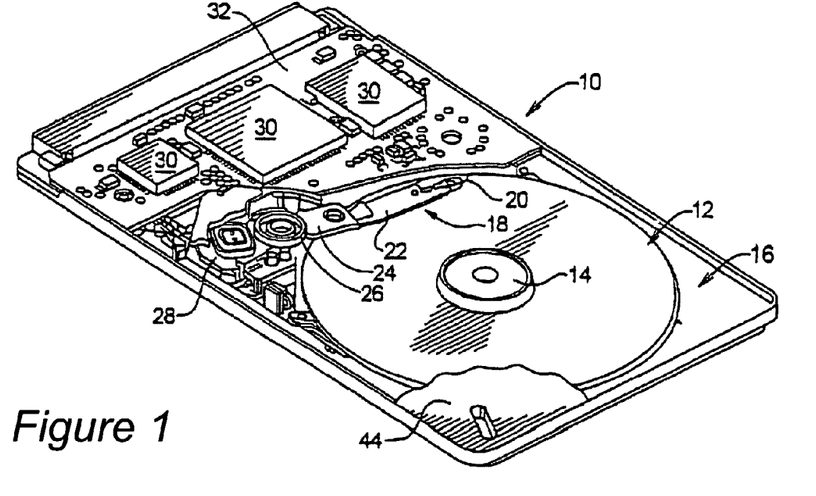
FIG. 1 is a perspective view of a disk drive with electronic circuits that are configured in accordance with some embodiments of the present invention.

A simplified diagrammatic representation of a disk drive, generally designated as 10, is illustrated in FIG. 1. The disk drive 10 includes a disk stack 12 (illustrated as a single disk in FIG. 1) that is rotated by a spindle motor 14. The spindle motor 14 is mounted to a base plate 16. An actuator arm assembly 18 is also mounted to the base plate 16. The disk drive 10 is configured to store and retrieve data responsive to write and read commands from a host device. A host device can include, but is not limited to, a desktop computer, a laptop computer, a personal digital assistant (PDA), a digital picture/video recorder/player, a digital music recorder/player, and/or another electronic device that can be communicatively coupled to the disk drive 10 to store and retrieve data.

The actuator arm assembly 18 includes a head 20 (or transducer) mounted to a flexure arm 22 which is attached to an actuator arm 24 that can rotate about a pivot bearing assembly 26. The head 20 may, for example, comprise an magnetoresistive (MR) element and/or a thin film inductive (TFI) element. An actuator motor 28 (e.g., a voice coil motor (VCM)) rotates the actuator arm assembly 18 to radially move the head 20 relative to the disk stack 12. The spindle motor 14 and actuator arm assembly 18 are coupled to a controller, read/write channel circuits, and other associated electronic circuits 30 which can be enclosed within one or more integrated circuit packages mounted to a printed circuit board (PCB) 32. The electronic circuits 30 may include analog and/or digital circuitry, and typically includes a processor(s) and memory device(s). The actuator arm assembly 18 may further include an articulated arm portion with the head 20 connected to a distal end thereof and which is moved by a microactuator, as is well known in the art.

Although FIG. 1 illustrates an exemplary disk drive, it will be understood that the present invention is not limited to such configurations, but is intended to encompass any configuration capable of carrying out the operations described herein.

Figure 2:
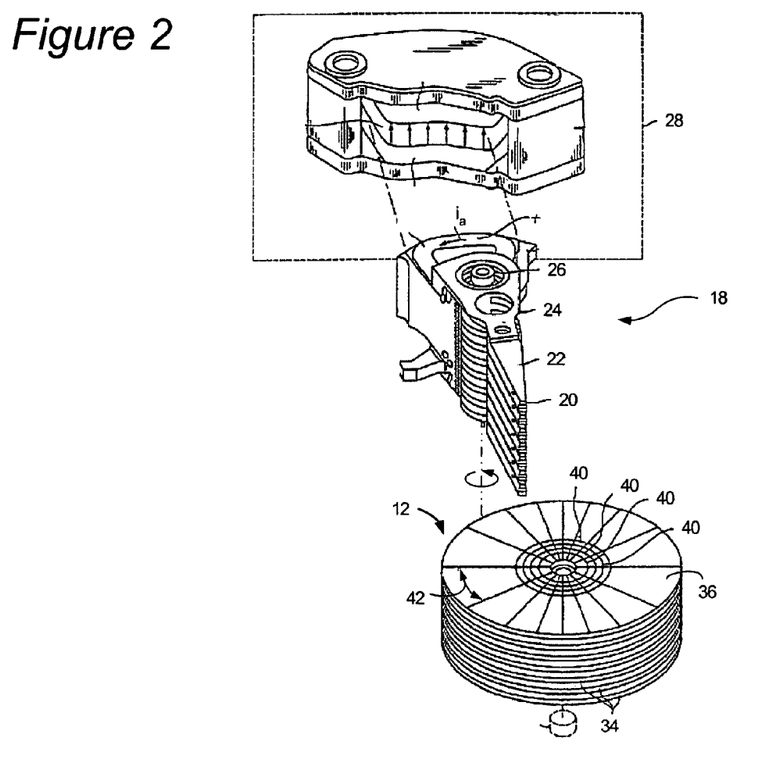
FIG. 2 is a block diagram of an exemplary head disk assembly of the disk drive of FIG. 1.

Referring now to the illustration of FIG. 2, the disk stack 12 typically includes a plurality of recordable data storage disks 34, each of which may have a pair of disk surfaces 36, 36. The disks 34 are mounted on a cylindrical shaft and are configured to rotate about axis 38. The spindle motor 14 as mentioned above, rotates the disk stack 12. Although the disks 34 are described as magnetic disks for purposes of illustration, they may alternatively be optical disks or any other type of readable and/or rewritable data storage disk.

The actuator arm assembly 18 can include a plurality of the heads 20, each of which are adjacent to a different one of the disk surfaces 36. Each head 20 is mounted to a corresponding flexure arm 22 which is attached to a corresponding portion of the actuator arm 24 that can rotate about the pivot bearing assembly 26. The actuator motor 28 operates to move the actuator arm 24, and thus moves the heads 20 relative to their respective disk surfaces 36.

Figure 3:
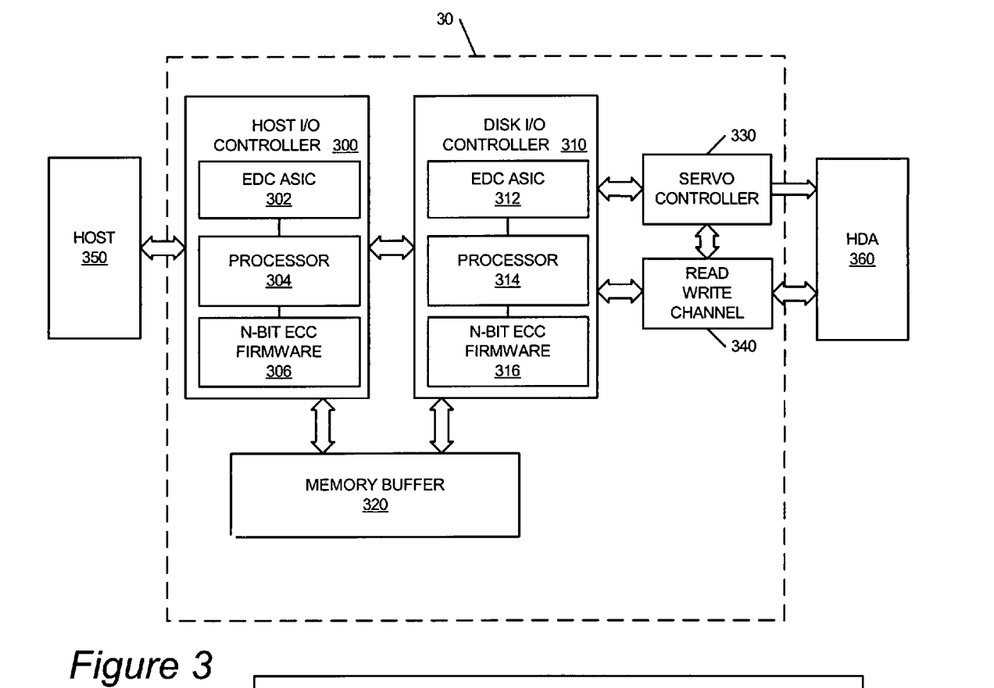
FIG. 3 is a block diagram of a portion of the controller of the disk drive of FIG. 1 and associated methods that are configured in accordance with some embodiments of the present invention.

Referring to FIG. 3, the electronic circuits 30 are configured to interface a host device 350 with a head disk assembly (HDA) 360. The HDA 360 can include the actuator arm assembly 18, the disk stack 12, the actuator motor 28, and the spindle motor 14. The electronic circuits 30 can include a host I/O controller 300, a disk I/O controller 310, an I/O memory buffer 320, a servo controller 330, and a read/write channel circuit 340. The exemplary embodiment of the electronic circuits 30 has been illustrated with three separate controllers 300, 310, 330, memory buffer 320, and read/write channel 340 for purposes of illustration and discussion only. It is to be understood that the functionality that is described herein for the controllers 300, 310, 330, memory buffer 320, and read/write channel 340 may be integrated within one integrated circuit package or distributed among more than one integrated circuit package. Moreover, although the disk I/O controller 310 has been illustrated as a single element within circuits 30 for ease of illustration and description, its functionality may be distributed across more than one data processing controller which may be separate from one another and communicate therebetween via one or more backplane busses and/or data networks.

The read write channel 340 can operate in a conventional manner to convert data between the digital form used by the disk I/O controller 310 and the analog form conducted through the heads 20 in the HDA 360. The read write channel 340 provides servo positional information read from disk 34 in the HDA 360 to the servo controller 330. The servo positional information can be used to detect the location of the head 20 in relation to logical block addresses (LBAs) on the disk 34. The servo controller 330 can use LBAs from the data controller 400 and the servo positional information to seek the head 20 to an addressed track and block on the disk 34, and to maintain the head 20 aligned with the track while data is written/read on the disk 34.

The host I/O controller 300 is configured to temporarily store write commands and associated data from the host device 350 in the memory buffer 320 until the disk I/O controller 310 writes the data to the disk 34. The memory buffer 320 may include, but is not limited to, a volatile/non-volatile integrated circuit memory. The disk I/O controller 310 is configured to carry out write commands by formatting the buffered data into blocks with the appropriate header information, and transferring the formatted data from the memory buffer 320, via the read/write channel 340, to the LBAs on the disk 34 that are identified by the associated write command. The host I/O controller 300 may operate in a Write Cache Enabled mode, which may be toggled on/off by a user defined setting, in which the host I/O controller 30 acknowledges to the host 350 that it has completed the write command after it has stored the received data into the memory buffer 320, but prior to the data actually being written by the disk I/O controller 310 to the disk 34.

Figure 4:
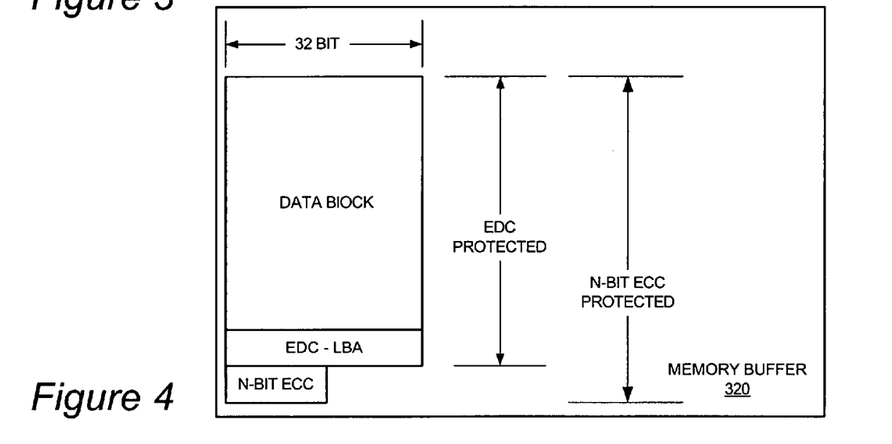
FIG. 4 is illustrates the memory buffer of FIG. 3 that contains a data block and appended error detection code and error correction code in accordance with some embodiments of the present invention.

The host I/O controller 300 also generates an error detection code and an error correction code for data received with a write command from the host 350, and stores the error detection code and the error correction code with the data in the memory buffer 320. FIG. 4 illustrates an error detection code and an error correction code that are appended to a data block and stored in the memory buffer 320 by the host I/O controller 300 in accordance with some embodiments of the present invention. As shown, the error detection code may be appended to the data along with the LBA identifying where the data is to be stored on the disk 34. An N-bit error correction code may be appended to the error detection code and the data. Accordingly, the data, the error detection code, and the error correction code can be stored in continuous memory locations in the memory buffer 320 to facilitate their subsequent retrieval by the disk I/O controller 310.

The disk I/O controller 310 retrieves the error detection code and the error correction code with the data from the memory buffer 320. The disk I/O controller 310 uses the retrieved error detection code to detect one or more errors in the retrieved data and, in response to detecting an error(s), uses the retrieved error correction code to attempt to correct the identified error(s) and to generate corrected data. After attempting to correct the detected error(s), the disk I/O controller 310 may reuse the error detection code to determine whether the error(s) was corrected. When no error was originally detected or when the error was corrected using the error correction code, the disk I/O controller 310 can write the data to the disk 34 via the read/write channel 340. The disk I/O controller 310 may also write the error detection code appended to the data on the disk 34. When the error was not corrected using the error correction code, the disk I/O controller 300 may signal the host I/O controller 300, via a write error flag, to request the host 350 to resend the write command to the disk drive 10.

The error detection code may include, but is not limited to, a CRC code which can provide a strong error detection capability to detect up to a defined number of bit errors in the data that occurred while the data was stored in the memory buffer 320, such as from solar particles inducing a soft error in the buffered data. The error correction code can be configured to correct one or more detected errors (i.e., N-bit error correction code) and may include, but is not limited to, a Hamming code, a BCH (Bose, Ray-Chaudhuri, Hocquenghem) code, or a block error code, such as a Reed-Solomon code.

Because the probability can be very low that a single-bit soft data error will occur during the brief time that the data is temporarily buffered in the memory buffer 320 before being written to the disk 34, it can be even much less probable that two or more bits of soft data error will occur in the temporarily buffered data. Consequently, the host I/O controller 300 can be configured to generate a 1-bit error correction code which, in accordance with some embodiments of the present invention, is a Hamming code. The data, the generated CRC code, and the generated Hamming code are stored in the memory buffer 320. More particularly, the host I/O controller 300 may generate a CRC bit pattern and Hamming code bit pattern based on the host data, and may store the data and appended CRC bit pattern and Hamming code bit pattern in the memory buffer 320. The Hamming code is configured to correct one error bit in a data block. When the disk I/O controller 310 is ready to write the data to the disk 34, such as following completion of another read/write command queued in the memory buffer 320, it can retrieve the data and the associated CRC code and Hamming code from the memory buffer 320, use the retrieved CRC code to error detect the retrieved data, and, in response to detecting an error, use the retrieved Hamming code to attempt to correct the error. The disk I/O controller 310 can write the corrected data to the disk 34 through the read/write channel 340.

Because the error detection code is used to error check each data block that is read from the memory buffer 320, the error detection code may be implemented in an application specific integrated circuit (ASIC) to enable high bandwidth error detection. In contrast, because the error correction code is used only when the error detection code has detected an error, which as explained above may occur very infrequently in the temporarily buffered data, the error correction code may be implemented as firmware that is executed by a processor, such as a general purpose processor or a digital signal processor.

Accordingly, the host I/O controller 300 may include an error detection code (EDC) ASIC 302 and a processor 304 that executes N-bit error correction code (ECC) firmware 306. The disk I/O controller 310 can similarly include an EDC ASIC 312 and a processor 314 that executes N-bit ECC firmware 316. The EDC ASICs 302 and 312 are configured to generate an error detection code, such as a CRC based code, and to use the error detection code to detect errors. The processors 304 and 314 may execute error correction code operations in firmware 306 and 316, respectively, to generate, for example, a Hamming code that is stored with data in the memory buffer 320, and to correct an N-bit error in the data. When the host I/O controller 300 is reading data from the memory buffer 320, the EDC ASIC 302 may respond to detection of a data error by interrupting the processor 304 to cause it to execute the ECC firmware 306 and attempt to correct the error. Similarly, when the disk I/O controller 310 is reading data from memory buffer 320, the EDC ASIC 312 may respond to detection of a data error by interrupting the processor 314 to cause it to execute the ECC firmware 316 and attempt to correct the error.

Figure 5:
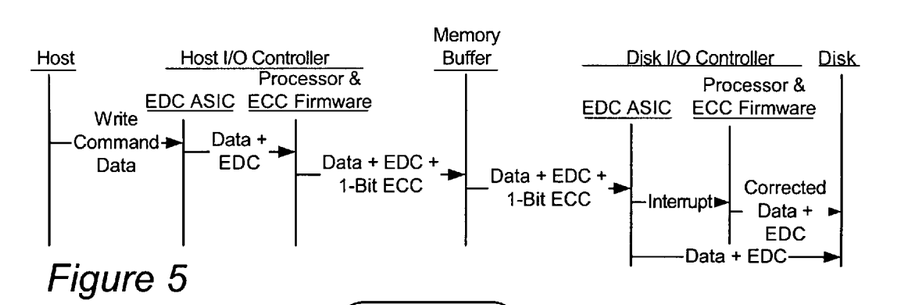
FIG. 5 is a data flow diagram that illustrates data flow and associated operations carried out in response to a host initiated write command to generate an error detection code and an error correction code that are temporarily stored with host data in the memory buffer of FIG. 3 before the data is written to the disk in accordance with some embodiments of the present invention.
Figure 6:
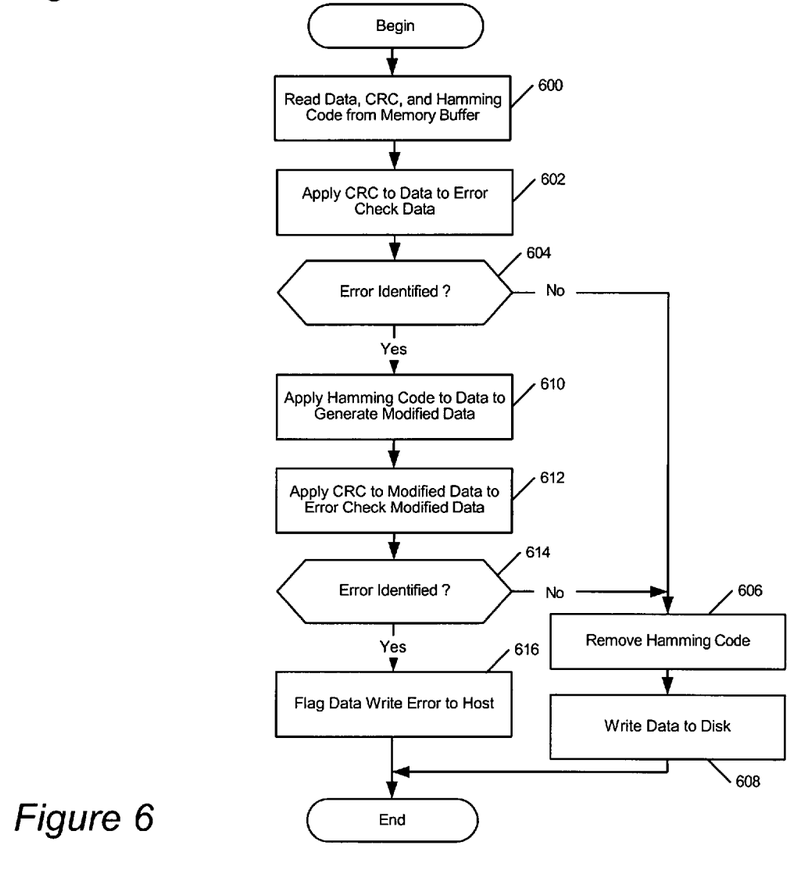
FIG. 6 is a flowchart of operations carried out in response to a host initiated write command to generate an error detection code and an error correction code that are temporarily stored with host data in the memory buffer of FIG. 3 before the data is written to the disk in accordance with some embodiments of the present invention.

FIG. 5 is a data flow diagram and FIG. 6 is a flowchart which collectively illustrate the data flow and associated operations that may be carried out in response to a host initiated write command so as to generate an error detection code and an error correction code that are temporarily stored with host data in the memory buffer 320 before the data is written to the disk 34, and which use the error detection code and the error correction code to error detect and correct data that is retrieved from the memory buffer 320. The host 350 communicates a write command that includes data to the EDC ASIC 302. The EDC ASIC 302 generates an error detection code, which for the exemplary embodiment is a CRC code, for the data and may append the CRC code to the data. The data and CRC code are provided to the processor 304 which generates an N-bit error correction code, which for this exemplary embodiment is a 1-bit error correcting Hamming code, which may be further appended to the data. The data, CRC code, and Hamming code are written to the memory buffer 320.

When the disk I/O controller 310 is ready to write the data to the disk 34 (e.g., having completed prior queued host commands), the EDC ASIC 312 retrieves (Block 600) the data and the CRC code, and may also retrieve the Hamming code, from the memory buffer 320. The EDC ASIC 312 error checks (Block 602) the retrieved data using the retrieved CRC code. When no error is identified (Block 604), the processor 314 writes (Block 608) the data and the CRC code to the disk 34. When the CRC code and the Hamming code are appended to the data and are read together with the data, the processor 314 removes (Block 606) the Hamming code from the block of data and CRC code so that the data and CRC code are written to the disk 34 without the Hamming code. Alternatively, the Hamming code may be written with the data and the CRC code to the disk 34.

When an error is detected using the CRC code (Block 604), the EDC ASIC 312 interrupts the processor 314 to initiate error correction using firmware 316 which applies the Hamming code (Block 610) retrieved from the memory buffer 320 to generate modified data which may have corrected the error. The EDC ASIC 312 applies the CRC code to error check the modified data (Block 612). When no error is identified (Block 614), the processor 314 writes (Block 608) the modified data and the CRC code to the disk 34 and, as described above, may remove the Hamming code (Block 606) when the CRC code and the Hamming code are appended to the data so that the data and CRC code are written to the disk 34 without the Hamming code. When the CRC error check of the modified data indicates that an error is still present therein, the processor 314 sets a flag (Block 616) to indicate to the host 350 that a write error has occurred. The write error flag may cause the host 350 to resend the write command to the disk drive 10.

In a similar manner, the host I/O controller 300 can be configured to temporarily store read commands from the host device 350 in the memory buffer 320 until the disk I/O controller 310 reads the addressed data from the disk 34. The disk I/O controller 310 responds to a buffered read command by reading the addressed data from the disk 34 and storing the data into the memory buffer 320. The host I/O controller 300 waits for a ready signal from the host 350 and then retrieves the data from the memory buffer 320 and outputs the data to the host 350 in response to the read command.

Figure 7:
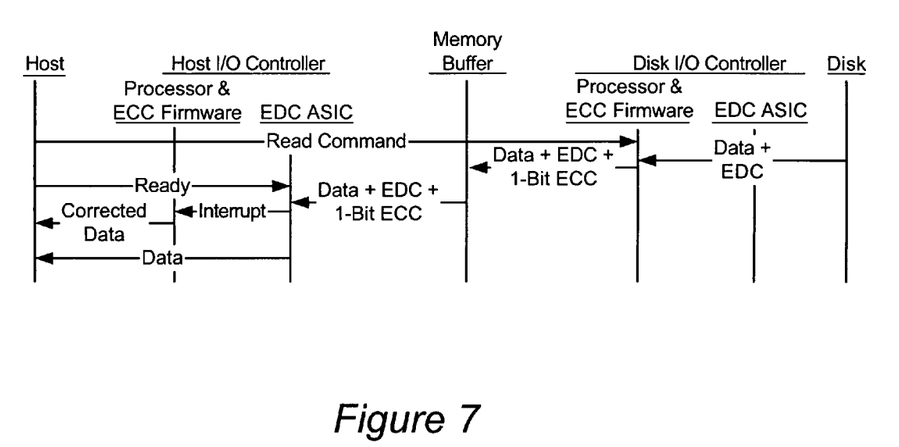
FIG. 7 is a data flow diagram that illustrates data flow and associated operations carried out in response to a host initiated read command to correct an error in data that is retrieved from the memory buffer of FIG. 3 before the data is output to the host device in accordance with some embodiments of the present invention.
Figure 8:
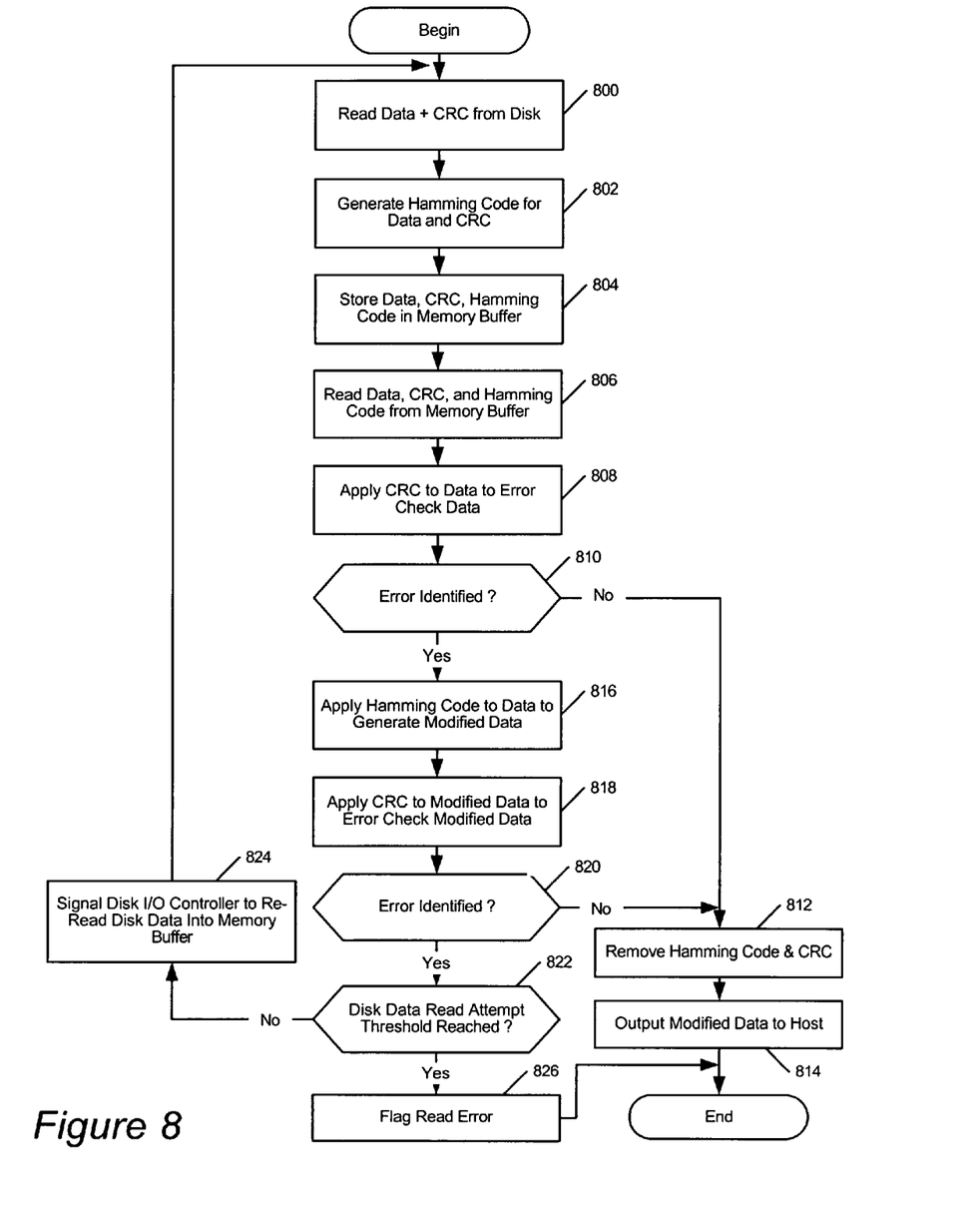
FIG. 8 is a flowchart of operations carried out in response to a host initiated read command to correct an error in data that is retrieved from the memory buffer of FIG. 3 before the data is output to the host device in accordance with some embodiments of the present invention.

FIG. 7 is a data flow diagram and FIG. 8 is a flowchart which collectively illustrate the data flow and associated operations that may be carried out in response to a host initiated read command. The illustrated data flow operations generate an error detection code and an error correction code that are temporarily stored in the memory buffer 320 with data that is then read from the disk 34 before the data is output to the host 350, and which use the error detection code and the error correction code to detect and correct a defined number of errors in data that is retrieved from the memory buffer 320 for output to the host 350. The host 350 communicates a read command to the processor 304 of the host I/O controller 300, which stores a read command in the memory buffer 320. The processor 314 of the disk I/O controller 310 reads (Block 800) the addressed data and associated CRC code from the disk 34. The processor 314 generates a Hamming code (Block 802) for at least the data, and may also protect the CRC code, and stores the data, the CRC code. The processor 314 stores (Block 804) the data, the CRC code, and the Hamming code in the memory buffer 320.

In response to a ready signal from the host 350 indicating that the host 350 is ready to receive data from the disk drive 10, the EDC ASIC 302 retrieves (Block 806) the data and the CRC code, and may also retrieve the Hamming code, from the memory buffer 320. The EDC ASIC 302 error checks (Block 808) the retrieved data using the retrieved CRC code. When no error is identified (Block 810), the processor 304 removes the Hamming code and the CRC code (Block 812) and outputs (Block 814) the data to the host device 350.

When an error is detected using the CRC code (Block 810), the EDC ASIC 302 interrupts the processor 304 to initiate error correction, via the Hamming operations in firmware 306, by applying the Hamming code (Block 816) that was retrieved from memory buffer 320 so as to attempt to correct the error and thereby generate modified data. The EDC ASIC 302 applies the CRC code to error check the modified data (Block 818). When no error is identified (Block 820), the processor 304 removes the Hamming code and the CRC code (Block 812) and outputs (Block 814) the corrected data to the host 350.

When the CRC error check (820) of the modified data indicates that an error is still present therein, the processor 304 determines whether a read attempt threshold has been reached (Block 822), and, if not, signals the disk I/O controller 310 (Block 824) to re-read the addressed data from the disk 34 into the memory buffer 320. Accordingly, the host I/O controller and disk I/O controller may attempt to re-reread data from the disk 34 when the error detection code identifies that an error that cannot be corrected by the error correction code, which for a Hamming error correction code would occur if more than one bit error occurs in a data block that is temporarily stored in the memory buffer 320.

When the processor 304 determines that the read attempt threshold has been reached (Block 822), the processor 304 may indicate to the host 350 (Block 826), via a read error flag, that the read command has failed.

Accordingly, as described herein, data that is temporarily stored in a memory buffer can be protected with an error detection code and an error correct code to enable correction of a defined number of bit errors that may occur while the data is awaiting transfer to a data storage media in a data storage device or transfer to a host device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of correcting errors in data, comprising:
generating an error correction code for data after the data is retrieved from non-volatile data storage;
buffering the retrieved data, a retrieved error detection code retrieved from non-volatile data storage with the retrieved data, and the generated error correction code in a memory buffer; and
applying the generated error correction code to generate corrected data for detected errors in data read from the memory buffer.

2. The method of claim 1, wherein the error detection code comprises a cyclic redundancy check (CRC) code based on the data; and wherein generating an error correction code for data retrieved from non-volatile data storage comprises generating a 1-Bit error correction code based on the retrieved data.

3. The method of claim 2, wherein:
the data read from the memory buffer is error detected using the CRC code; and
in response to detecting an error, the 1-Bit error correction code is applied to correct a single Bit error in the read data so as to generate the corrected data.

4. The method of claim 3, wherein:
the error detection code comprises a CRC bit pattern;
the error correction code comprises a Hamming code bit pattern; and
buffering the retrieved data, the retrieved error detection code, and the generated error correction code in the memory buffer comprises storing a representation of the retrieved data, the retrieved CRC bit pattern, and the generated Hamming code bit pattern in the memory buffer.

5. The method of claim 1 further comprising:
generating an error detection code and an error correction code with a data storage device for data received from a host device;
temporarily storing the data, the error detection code, and the error correction code in a memory buffer awaiting more permanent storage of the data in the non-volatile data storage media within the data storage device;
detecting errors in data retrieved from the memory buffer using an error detection code retrieved from the memory buffer; and
in response to identifying an error, applying error correction code retrieved from the memory buffer to the retrieved data to generate corrected data that is stored in the non-volatile data storage media.

6. The method of claim 5, wherein the data storage device comprises a magnetic disk drive, and, in response to detecting an error, error correction code retrieved from the memory buffer is applied to the data retrieved from the memory buffer to generate the corrected data that is written to a magnetic data storage disk in the magnetic disk drive.

7. The method of claim 5, wherein the data storage device comprises an optical disk drive, and, in response to detecting an error, error correction code retrieved from the memory buffer is applied to the data retrieved from the memory buffer to generate the corrected data that is written to an optical data storage disk in the optical disk drive.

8. The method of claim 5, wherein, in response to determining that the non-volatile data storage media is ready to receive data from the memory buffer, the data is retrieved from the memory buffer and error detected using error detection code retrieved from the memory buffer.

9. The method of claim 5, wherein the error detection code is stored with the modified data at a shared logical block address of the non-volatile data storage media.

10. The method of claim 9, further comprising:
outputting the corrected data to the host device.

11. The method of claim 1, wherein, in response to a ready signal from a host device, the data is retrieved from the memory buffer and error detected using the error detection code from the memory buffer.

12. A circuit comprising:
a memory buffer; and
at least one controller that generates an error detection code and an error correction code for data; that stores the data, the error detection code, and the error correction code in the memory buffer; that error detects data retrieved from the memory buffer using the error detection code; that, in response to detecting an error, applies the error correction code to the retrieved data to generate corrected data; and that uses the error detection code to determine if the corrected data contains errors.

13. The circuit of claim 12, wherein the controller generates a cyclic redundancy check (CRC) code based on the data, and generates a 1-Bit error correction code based on the data.

14. The circuit of claim 13, wherein the controller error detects data retrieved from the memory buffer using the CRC code, and, in response to detecting an error, applies a 1-Bit error correction code to correct a single Bit error in the retrieved data so as to generate the corrected data.

15. The circuit of claim 14, wherein the controller error generates the CRC code by combining a CRC bit pattern with the data, generates the 1-Bit error correction code by combining a Hamming code bit pattern with the data, and stores a representation of the data, the CRC bit pattern, and the Hamming code bit pattern in the memory buffer.

16. The circuit of claim 12, wherein the controller generates a new error correction code for data retrieved from a data storage media, temporarily stores the data and error detection code retrieved from the data storage media and the new error correction code in the memory buffer awaiting output of the data to a host device, error detects data retrieved from the memory buffer using the buffered error detection code from the data storage media, that, in response to detecting an error, applies the error correction code to the retrieved data to correct the data for output to the host device.

17. The circuit of claim 12, wherein the controller comprises:
- a cyclic redundancy check (CRC) circuit that error detects data retrieved from the memory buffer using a CRC code; and
- a Hamming code processor that, in response to the CRC circuit detecting an error, carries out a Hamming code on the retrieved data to generate corrected data.

18. The circuit of claim 17, wherein the Hamming code processor comprises a general purpose processor that executes a Hamming code program, and the CRC circuit responds to detection of an error by interrupting the Hamming code processor to initiate execution of the Hamming code program.

19. A disk drive comprising:
- a non-volatile data storage disk;
- an integrated circuit memory buffer; and
- at least one controller that generates an error detection code and an error correction code for data from a host device, that stores the data, the error detection code, and the error correction code in the memory buffer, that error detects data retrieved from the memory buffer using the error detection code, that, in response to detecting an error, applies the error correction code to the retrieved data to generate corrected data, and that writes the corrected data in the disk.

* * * * *